United States Patent [19]

Graves et al.

[11] Patent Number: 6,100,719

[45] Date of Patent: Aug. 8, 2000

[54] LOW-VOLTAGE BUS SWITCH MAINTAINING ISOLATION UNDER POWER-DOWN CONDITIONS

[75] Inventors: Christopher M. Graves; Steven E. Marum, both of Sherman, Tex.

[73] Assignee: Texas Instruments Incorporated, Dallas, Tex.

[21] Appl. No.: 09/221,886

[22] Filed: Dec. 28, 1998

Related U.S. Application Data

[60] Provisional application No. 60/068,967, Dec. 30, 1997.

[51] Int. Cl.[7] .............................................. H03K 19/0175
[52] U.S. Cl. ................................................ 326/86; 326/21
[58] Field of Search .................................. 326/30, 21, 82, 326/86, 113

[56] References Cited

U.S. PATENT DOCUMENTS

| 4,972,377 | 11/1990 | Lee | 365/226 |
| 5,397,641 | 3/1995 | Merrill | 307/475 |
| 6,034,553 | 3/2000 | Kwong | 326/86 |

*Primary Examiner*—Michael Tokar
*Assistant Examiner*—Anh Tran
*Attorney, Agent, or Firm*—W. Daniel Swayze, Jr.; W. James Brady, III; Frederick J. Telecky, Jr.

[57] ABSTRACT

A control circuit for a low-voltage bus switch where the control circuit keeps the bus switch open by stealing power from switch I/O terminals during the loss of supply voltage and thereby maintaining bus isolation. The control circuit also provides a good high level and presents a low switch impedance.

20 Claims, 5 Drawing Sheets

LOW-VOLTAGE BUS SWITCH MAINTAINING ISOLATION UNDER POWER-DOWN CONDITIONS

This application claims priority under 35 USC §119(e)(1) of provisional application No. 60/068,967 filed Dec. 30, 1997.

BACKGROUND AND SUMMARY OF THE INVENTION

The present invention relates to CMOS bus switching structures, especially to those operating under constraints of high speed and low power.

Background

Technological advances in digital electronics have led to circuits operating at ever increasing speeds. With the increase in speed comes a thermal restriction which drives circuit designers to use lower voltage circuits. As a result, low-voltage bus switches are required to maintain the high-speed data traffic in these systems. Low-voltage crossbar switches provide a necessary solution for maintaining reliable data traffic in these high-speed systems. However, low-voltage bus switches require stringent control of power supply sequencing to avoid the injection of disturbances onto the bus when power comes up.

Prior Art Structures

Crossbar switches have been in existence for some time and are commonly used in multiprocessor computing systems, telephone switching systems, and other complex systems. A crossbar switch is one which has a number of vertical and horizontal paths, and is controlled for the purpose of connecting any one vertical path with any one horizontal path. The concept is particularly relevant to computers where a number of buses are interconnected.

A very basic prior-art CMOS switch (as shown in FIG. 2 and discussed later in more detail) may use an N-channel pass transistor controlled by an output-enable signal OE with a supply voltage of 5 V. A problem with this implementation is that the NMOS threshold voltage $V_T$ causes a loss of headroom: if line A is at 5 V, the switch shown cannot pull line B above about 4 V (or more precisely, VCC-$V_{TN}$).

One circuit which addresses this problem adds a P-channel pass transistor in parallel with the N-channel pass transistor (as shown in FIG. 3 and discussed later). An inverter is also added between the output-enable circuit and the PMOS transistor, so that both of the pass transistors turn on and off at approximately the same time. This "pass gate" configuration eliminates the headroom problem with low power supply voltages since the output can go as high as the input voltage (no saturation). However, a new problem is created when the voltage supply is powered-down. Under power down conditions, the PMOS transistor may be on (if its gate voltage leaks down to ground while its source is still above the absolute value of $V_{TP}$). This means that the two buses will no longer be isolated from one another and will lead to undesirable bus disturbances.

Another drawback to the NMOS/PMOS parallel implementation occurs when there is a large positive spike on one of the bus connections. Adding the P-channel pass transistor in parallel to the NMOS device makes the circuit susceptible to input overvoltages when the device is in the blocking state. In this case, if a voltage appears on one of the bus lines which is more than one $V_{TP}$ above the PMOS gate voltage (which is at the power supply voltage VCC), the PMOS will begin to turn on, and the spike will propagate through. This result is very undesirable and may result in unreliable bus signals and even disable a system.

Bus-Isolation Control Circuit for a Low-Voltage Bus Switch

The present application discloses a circuit which improves reliability and predictability of circuit performance during power sequencing of low-voltage CMOS crossbar switches. A voltage reference circuit monitors the state of the power supply and provides a control signal when the supply is powered up or down. The control signal is input to blocking transistors, which can provide power to the bus switch when the supply is powered down. The control circuitry basically steals power from either I/O terminal when the supply voltage goes down. The gate of the PMOS is pulled high to keep the switch open and isolate the buses.

An advantage of this solution is that it allows for the creation of a new family of low-voltage crossbar switches which work well in reduced power supply voltage applications. Another advantage is that it is not necessary for the bus switches to be powered up before any voltage hits the bus lines. This method eliminates the need for special power-sequencing circuitry in the system design, resulting in a less complex, and therefore, less expensive system, especially for "hot swappable" cards which will be plugged in with the system power on.

BRIEF DESCRIPTION OF THE DRAWINGS

The disclosed inventions will be described with reference to the accompanying drawings, which show important sample embodiments of the invention and which are incorporated in the, specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Bus Isolation Control Switch

Figure 1:
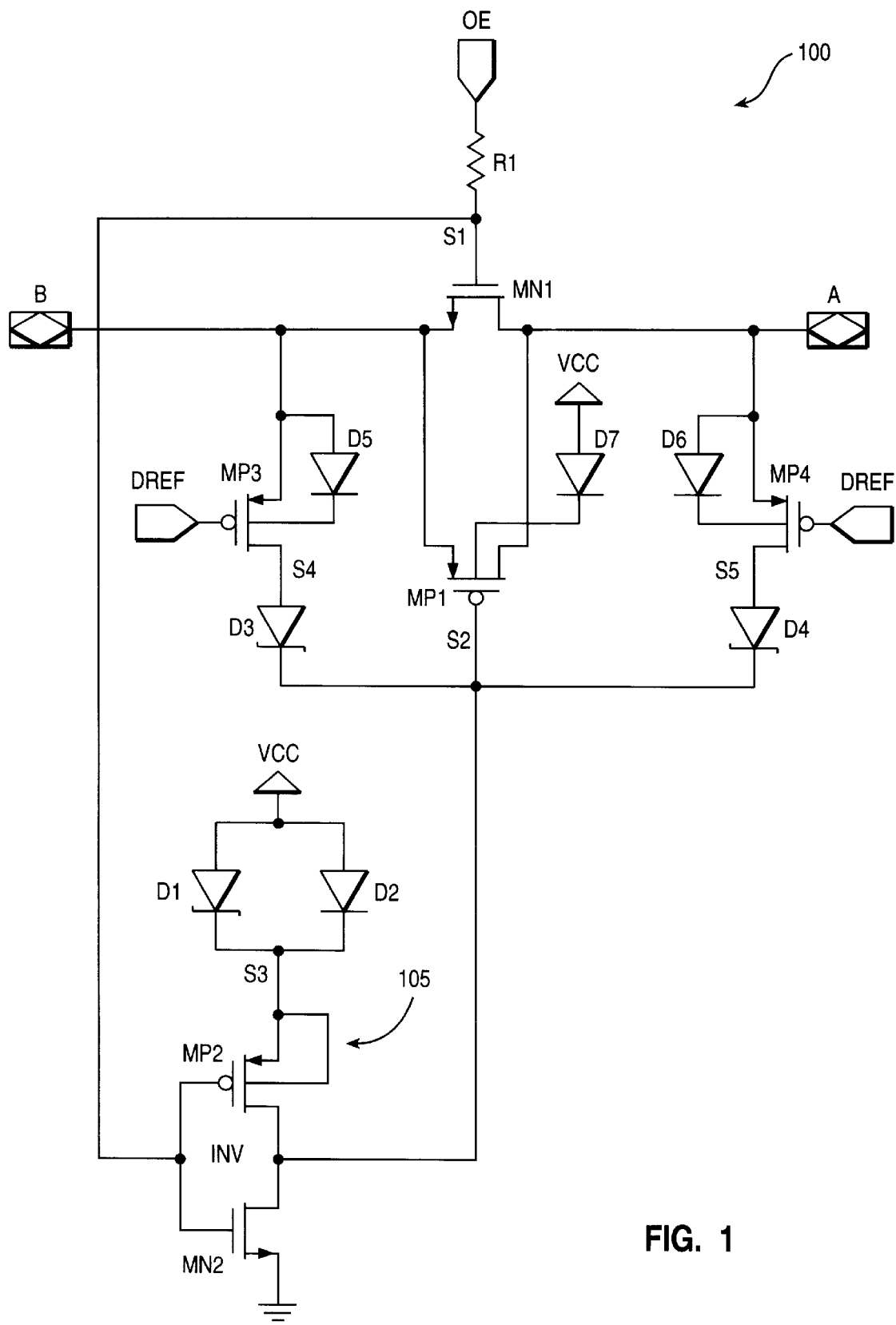
FIG. 1 shows the preferred embodiment of a bus switch with the power-control circuit.

FIG. 1 shows the preferred embodiment of the bus switch with a power-down circuit. This schematic shows a single bus switch element 100 comprising NMOS and PMOS pass transistors MN1 and MP1, respectively, in parallel with additional power-down control circuitry. The central concept of operation is that pass transistor MP1 turns off when either terminal A or B is greater than node S2, which is typically at VCC (or which may even be at 0 volts).

When the power supply VCC is on (VCC=3.3 V), the control signal DREF is high (see FIG. 4), which keeps blocking transistors MP3 and MP4 off, and node S2 unaffected.

When the power supply VCC is being powered-down or finally off (VCC=0 V), the control signal DREF is low, which pulls the gates of blocking transistors MP3 and MP4 to a low voltage. If either of terminals A or B has a voltage that is greater than $V_{TP}$ (the threshold voltage of either of the PMOS blocking transistors), then the corresponding blocking transistors MP4 or MP3, respectively, will turn on. Turning on either of blocking transistors MP3 or MP4 allows the gate of pass transistor MP1 to be pulled high and effectively ensures that MP1 is turned off. With MP1 turned off, the bus switch 100 is off and any signals present at the input terminal A are prevented from propagating to the output. Therefore, power is effectively drawn from terminals A or B to open the bus switch 100 under a power-down condition. In order to assure that node S2 is pulled high and that no path exists between terminals A and B, blocking Schottky diodes D3 and D4 are added in series with the blocking transistors MP3 and MP4, respectively. Schottky diodes are used because the forward voltage drop is less than the $V_T$ of the PMOS pass transistor MP1. This is important since this diode drop is effectively equal to $-V_{gs}$ or $-V_{gd}$ of MP1 and hence will turn the pass transistor MP1 off.

An inverter circuit 105 is added to provide near simultaneous switching of transistors MN1 and MP1 by generating complementary control signals to the complementary switching transistors MN1 and MP1. Blocking diodes D1 and D2 are added between VCC and the source of transistor MP2 to allow node S2 to be pulled high during a power-down event. Diode D2 provides a low impedance path during switching while diode D1 provides a higher "up level" from the gate of transistor MP2. Without diodes D1 and D2, and since transistor MP2 is on and VCC=0 V, current will flow through the path that has been created from node S2 the low voltage or VCC, which keeps node S2 low and transistor MP1 on. PN diodes D5 and D6 are included in the backgates of transistors MP3 and MP4 to block any leakage current through MP3 and MP4. The well tie for device MP3 is provided by diode D5, and the well tie for device MP4 is provided by diode D6.

When VCC is off and terminals A and B are in a low state, there is no power to turn the PMOS pass transistor MP1 off. Even though the gate voltage of the PMOS pass transistor MP1 is low in this case, transistor MP1 will not be conducting because the voltage at the source and drain of MP1 is low. However, if the voltage on either terminal A or B begins to ramp high, pass transistor MP1 would turn on when the input voltage reaches a $V_{TP}$ above node S2. Since the source terminals of blocking transistors MP3 and MP4 are also connected directly to the terminal pads A and B, respectively, transistors MP3 and MP4 will want to turn on as well, when the input voltage reaches a $V_{TP}$ above ground. Node S2 is pulled positive, keeping transistor MP1 off. Diode D7 is added to the backgate of pass transistor MP1 to block any leakage current to VCC when the device is powered down.

Reference Circuit

Figure 4:
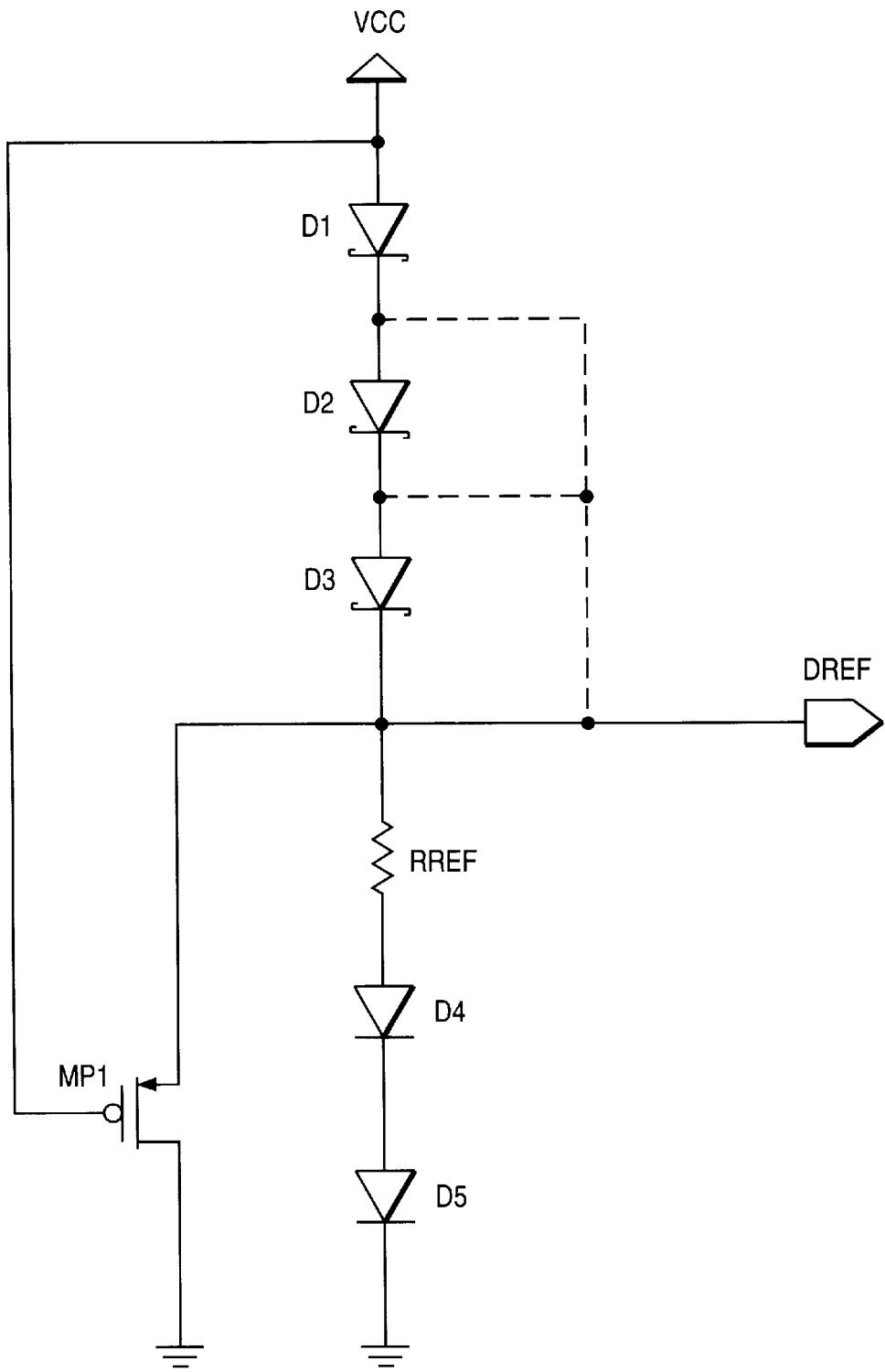
FIG. 4 shows a power supply voltage reference circuit.

FIG. 4 shows a power supply voltage reference circuit. The voltage reference circuit is used to provide a control signal DREF for the bus switch shown in FIG. 1. The control signal DREF voltage is essentially equal to VCC minus a Schottky diode voltage drop. The schematic shows three Schottky diodes, D1, D2, and D3 (of which diodes D2 and D3 are being shown as optional) to lower the reference voltage and effectively turn on blocking transistors MP3 and MP4 (FIG. 1) sooner if required to keep the switch open. A resistor RREF is used to minimize the current drawn from the power supply. The additional diodes, D4 and D5, help to reduce the voltage drop across the resistor RREF, thereby reducing its voltage value for a set current level. A PMOS transistor MP1 is introduced with its gate tied to VCC to ensure a known voltage state in either power situation (e.g. on or off). When VCC=3.3 V, the transistor MP1 is off and the output DREF is held at a diode drop (across D1) below VCC. However, when VCC is powered-down, transistor MP1 turns on and pulls the output signal DREF to ground to ensure that the gate of transistors MP3 and MP4 (FIG. 1) are low. This is critical as the gate of the PMOS pass transistor MP1 needs to be pulled high very quickly in order to open the bus switch during power-down.

Alternative Embodiment: Less Preferred Switch

Figure 5:
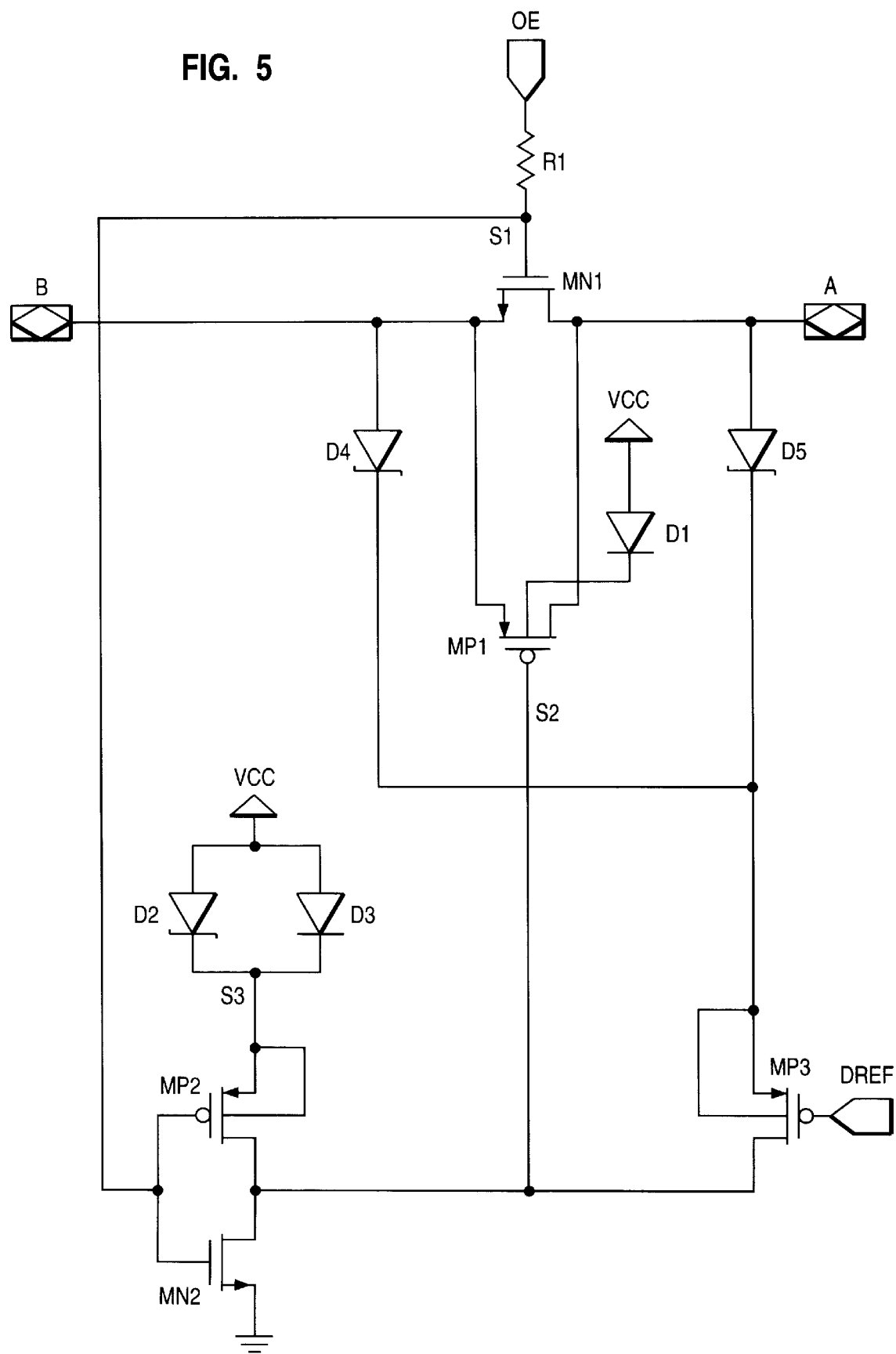
FIG. 5 shows an improved prior art switch.

FIG. 5 shows an improved but less preferred switch. The difference between this circuit and the preferred embodiment is the order of the Schottky diodes and the PMOS blocking transistor MP3. Additionally, since the Schottky diodes are tied directly to the I/O pins A and B, there is only one blocking transistor needed to pull node S2 high in the event either of I/O pins A or B present a higher voltage at node S2. The problem with this circuit occurs when VCC=0 V, and both I/O pins are at zero volts. As soon as the I/O signals begin to ramp up and reach the $V_{TP}$ of transistor MP1, transistor MP1 will turn on and pass the signal. There will be a delay before MP3 turns on since its source voltage is a Schottky diode voltage drop (either diode D4 or D5) below the voltage present at the terminals of the pass transistor MP1. This circuit works fine for DC applications, but the buses are not isolated for a brief period under transient conditions due to the diode voltage drop difference between transistors MP1 and MP3.

Conventional Crossbar Switch

Figure 2:
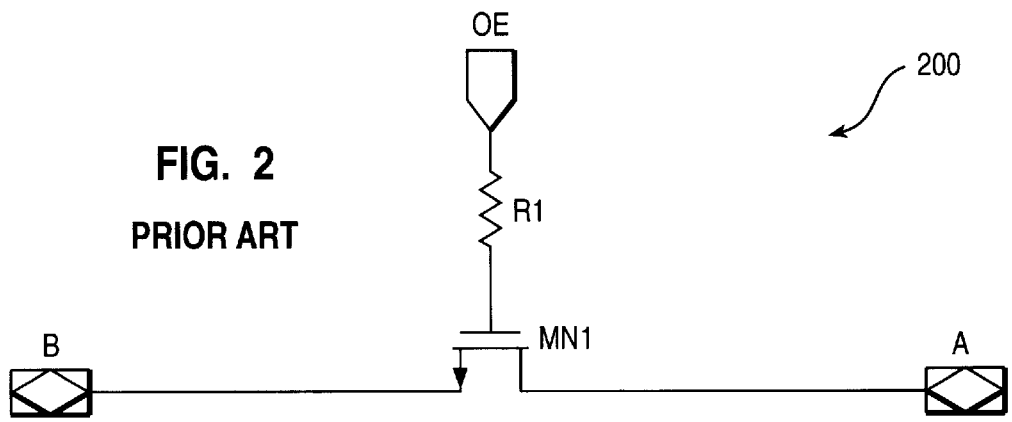
FIG. 2 shows a basic CMOS crossbar switch.

Early crossbar switching devices were mechanical in nature and were eventually relegated to slow-speed applications. Present-day circuits are predominantly in the high-speed regime and require high switching speeds. FIG. 2 shows a conventional NMOS crossbar switch 200 which is typical of an input/output configuration of a bus switch. The switch 200 comprises an N-channel pass transistor MN1 controlled by an output-enable OE signal. When the output-enable signal OE drives the gate of the N-channel pass transistor MN1 high, the transistor MN1 is on, and the switch 200 is closed. This scenario allows signals to pass between terminals A and B. When the gate voltage (OE signal) is low, the pass transistor MN1 is off and the switch is open. Signals are now prevented from passing between terminals A and B. During a power-down event, the gate of the transistor MN1 will be low and therefore the switch 200 will be open (without any special control circuitry).

A problem with this implementation occurs when the power supply voltage is lowered (e.g. to 3.3 V+/-10%, or lower). Under nominal conditions, the output voltage of the switch 200 will have a maximum value of approximately 1 V less than the gate voltage on the NMOS pass transistor MN1 due to the device threshold voltage $V_T$ and device body effect. The voltage drop is even greater under worst-case conditions when the control voltage at the gate of MN1 is at the low end of its range, and/or when the threshold voltage of MN1 is higher than nominal due to processing variations. The output voltage at terminal B will peak at an even lower and hence unacceptable level. Hence the device turn-on specification cannot be met.

Conventional Crossbar Switch with PMOS in Parallel

Figure 3:
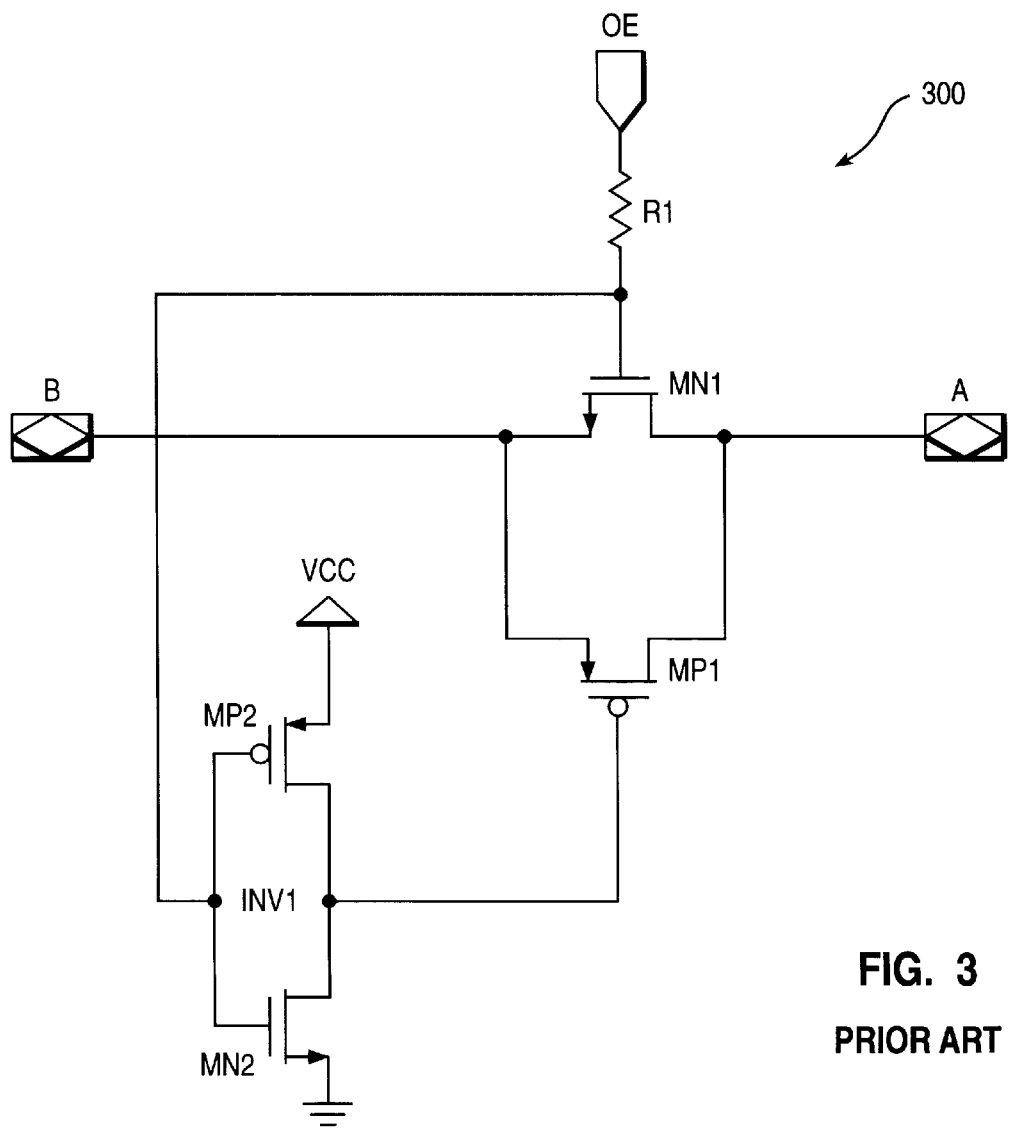
FIG. 3 shows a crossbar switch with additional PMOS pass transistor.

FIG. 3 shows a conventional crossbar switch 300 with a PMOS pass transistor MP1 added in parallel with the N-channel pass transistor MN1. An inverter INV1 is also added between the output-enable circuit OE and the gate of the PMOS transistor MP1. The inverter INV1 is included so that both of the pass transistors, MN1 and MP1, turn on and off at approximately the same time. This configuration eliminates the previously described problem in FIG. 2 (e.g. a reduction in voltage headroom), since the output at terminal B can go as high as the input voltage (no saturation) at terminal A.

A problem with this implementation occurs when the voltage supply is powered down. The gate voltage of the P-channel pass transistor MP1 will be approximately 0 V, as there is no voltage available to pull this node high. This causes the PMOS transistor MP1 to be on (if either bus is at a voltage above $V_{TP}$), which is equivalent to the bus switch 300 being closed. Under this power down condition, the two buses will no longer be isolated from one another, and undesirable bus disturbances will result.

Another disadvantage of the NMOS/PMOS parallel implementation occurs when there is a large positive spike on an input terminal A. When there was just an NMOS pass transistor MN1, an overvoltage on the input terminal A would have no effect on the performance of the switching device 200. However, adding the P-channel pass transistor MP1 makes the circuit susceptible to input overvoltages when the device is in the blocking state. Since the gate voltage of the PMOS transistor MP1 is high (3.3 V) when the switch 300 is open, an overshoot greater than the gate voltage plus the threshold voltage $V_T$ (approximately 4.3 V) of the PMOS MP1 will cause the transistor MP1 to turn on and effectively close the switch 300.

Input Spiking Resolved

The output circuit shown in FIG. 1 solves the input overvoltage problem as well. Conditions conducive to an overvoltage problem occur when the crossbar is disabled. This means that the gate voltages for transistors MP1, MP3, and MP4 are approximately 3 V under normal operating conditions. A positive voltage spike at either terminal A or B appears at either the source or drain of MP1 as well as at one of the sources of the connected blocking transistors MP3 or MP4. If the magnitude of the spike is greater than one $V_{TP}$ voltage level above the control signal DREF, then either transistor MP3 or MP4 will turn on and pass the voltage spike to the gate of transistor MP1. This assures that the voltage drop from gate-to-drain or gate-to-source will be less than the $V_T$ of transistor MP1 and will keep the switch 100 open.

Hot-Swappable Applications

Figure 6:
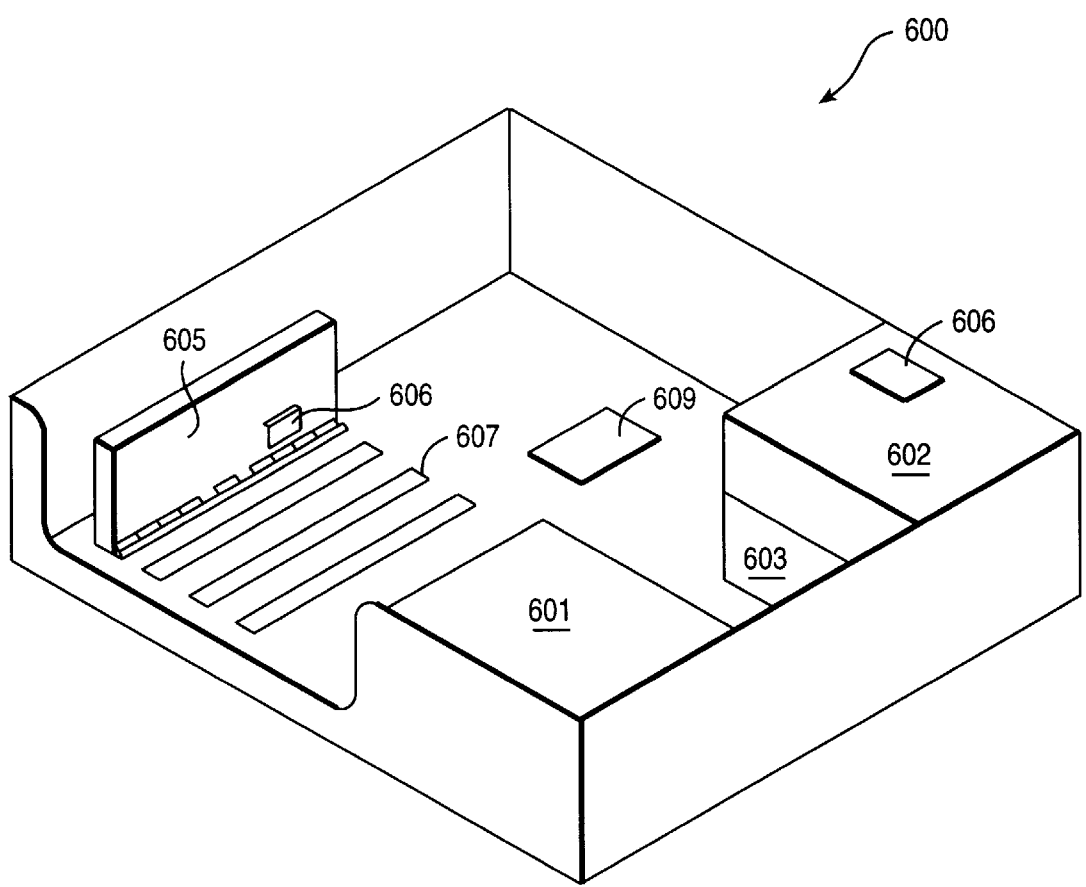
FIG. 6 shows a computer utilizing hot-swappable components comprising the innovative circuit.

FIG. 6 shows a computer utilizing hot-swappable components comprising the innovative circuit. In systems that require long periods of uninterrupted operation, the innovative circuit provides a means for replacing devices or modules without powering down the primary system. For example, in a computer system 600, the innovative circuit 606 may be used for hot-swappable applications where a card 605 inserted into a slot 607 or perhaps a disk drive 602 or 603 may be replaced on-the-fly. The power supply 601 provides continuous power to the system processor 609 and computer system 600 without the need to power-down for replacing drives or cards.

According to disclosed class of innovative embodiments, there is provided: A bus switching circuit, comprising: NMOS and PMOS transistors, connected in parallel between two ports to conduct signals therebetween, and also connected to receive complementary signals at respective control terminals thereof; and first and second blocking circuits, commonly connected to a control terminal of said PMOS transistor, and separately connected to draw power from respective said ports; wherein each said blocking circuit prevents said PMOS transistor from turning on and conducting said signals between said ports, when the voltage at said PMOS control terminal is less than said signal voltage at either of said ports.

According to another disclosed class of innovative embodiments, there is provided: A bus switching circuit, comprising: first and second complementary switching transistors connected in parallel, and having respective control terminals connected to receive complementary control signals; wherein said switching transistors are jointly interposed between an input port and an output port to conduct signals therebetween; and first and second blocking circuits; wherein said first blocking circuit is connected to receive a power-valid signal and is interposed between said input port and said control terminal of said second switching transistor; and wherein said second blocking circuit receives said reference signal and is interposed between said output port and said control terminal of said second switching transistor; whereby said first and second blocking circuits prevent voltage fluctuations at either of said ports from turning on said second switching transistor; and whereby said second switching transistor is allowed to conduct signals when power is on, and provides isolation between said ports when power is turning off, or off.

According to another disclosed class of innovative embodiments, there is provided: An insertable electronic module, comprising: functional circuits; and a bus switching circuit, comprising: NMOS and PMOS transistors, connected in parallel between two ports to conduct signals therebetween, and also connected to receive complementary signals at respective control terminals thereof; and first and second blocking circuits, commonly connected to a control terminal of said PMOS transistor, and separately connected to draw power from respective said ports; wherein each said blocking circuit prevents said PMOS transistor from turning on and conducting said signals between said ports, when the voltage at said PMOS control terminal is less than said signal voltage at either of said ports.

According to another disclosed class of innovative embodiments, there is provided: A method for controlling a bus switching circuit, comprising the following steps: in a first mode, switching at least complementary first and second devices, said devices connected in parallel and jointly interposed between first and second ports; and in a second mode, drawing power from either of said ports whenever power is present thereon, to maintain said second device in an off state, even when power is not otherwise available to said switching circuit; whereby signals present at said first port are prevented from appearing at said second port.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, as will be obvious to those of ordinary skill in the art, other circuit elements can be added to, or substituted into, the specific circuit topologies shown.

For another example, within the constraints well-known to those of ordinary skill, nonlinear devices can be added in series with (or used to replace) resistors, to increase the impedance of load devices.

For another example, within the constraints well-known to those of ordinary skill, a variety of well-known amplifier configurations can be substituted for those shown.

For another example, within the constraints well-known to those of ordinary skill, complementary circuits can be used in a positive ground system, to ensure that the NMOS stays off.

What is claimed is:

1. A bus switching circuit, comprising:

NMOS and PMOS transistors, connected in parallel between two ports to conduct signals therebetween, and also connected to receive complementary signals at respective control terminals thereof; and first and second blocking circuits, commonly connected to a control terminal of said PMOS transistor, and separately connected to draw power from respective said ports; wherein each said blocking circuit prevents said PMOS transistor from turning on and conducting said signals between said ports, when the voltage at said PMOS control terminal is less than said signal voltage at either of said ports.

2. The circuit of claim 1, wherein said PMOS transistor switches nearly simultaneously with said NMOS transistor.

3. The circuit of claim 1, wherein said blocking circuits comprise Schottky diodes.

4. The circuit of claim 1, wherein each of said blocking circuits comprise a PMOS device in series with a Schottky diode.

5. The circuit of claim 1, wherein said transistors are switching transistors.

6. A bus switching circuit, comprising:

first and second complementary switching transistors connected in parallel, and having respective control terminals connected to receive complementary control signals; wherein said switching transistors are jointly interposed between an input port and an output port to conduct signals therebetween; and first and second blocking circuits; wherein said first blocking circuit is connected to receive a power-valid signal and is interposed between said input port and said control terminal of said second switching transistor; and wherein said second blocking circuit receives said reference signal and is interposed between said output port and said control terminal of said second switching transistor;

whereby said first and second blocking circuits prevent voltage fluctuations at either of said ports from turning on said second switching transistor; and whereby said second switching transistor is allowed to conduct signals when power is on, and provides isolation between said ports when power is turning off, or off.

7. The circuit of claim 6, wherein said complementary transistors switch nearly simultaneously.

8. The circuit of claim 6, wherein said blocking circuits comprise Schottky diodes.

9. The circuit of claim 6, wherein said blocking circuits comprise PMOS devices in series with Schottky diodes.

10. The circuit of claim 6, wherein said transistors are switching transistors.

11. The circuit of claim 6, wherein said first transistor is NMOS, and said second transistor is PMOS.

12. An insertable electronic module, comprising:

functional circuits; and a bus switching circuit, comprising:

NMOS and PMOS transistors, connected in parallel between two ports to conduct signals therebetween, and also connected to receive complementary signals at respective control terminals thereof; and first and second blocking circuits, commonly connected to a control terminal of said PMOS transistor, and separately connected to draw power from respective said ports; wherein each said blocking circuit prevents said PMOS transistor from turning on and conducting said signals between said ports, when the voltage at said PMOS control terminal is less than said signal voltage at either of said ports.

13. The module of claim 12, wherein said blocking circuits comprise Schottky diodes.

14. The module of claim 12, wherein each of said blocking circuits comprise a PMOS device in series with a Schottky diode.

15. A method for controlling a bus switching circuit, comprising the following steps:

(a.) in a first mode, switching at least complementary first and second devices, said devices connected in parallel and jointly interposed between first and second ports; and (b.) in a second mode, drawing power from either of said ports whenever power is present thereon, to maintain said second device in an off state, even when power is not otherwise available to said switching circuit;

whereby signals present at said first port are prevented from appearing at said second port.

16. The method of claim 15, wherein power is also sometimes drawn from said ports in said first mode, to prevent turn-on of said complementary devices.

17. The method of claim 15, wherein said first mode comprises controlling the gate of said first device, and said second device switches nearly simultaneously with said first device.

18. The method of claim 15, wherein said first and second devices are NMOS and PMOS transistors, respectively.

19. The method of claim 15, wherein said second mode comprises first and second blocking circuits, said first blocking circuit being interposed between said first port and a control terminal of said second transistor, and said second blocking circuit being interposed between said output port and said control terminal.

20. The method of claim 19, wherein said blocking circuits each comprise a PMOS transistor in series with a Schottky diode, said PMOS transistor receiving a reference voltage at a control terminal.

* * * * *